United States Patent
Tai et al.

(10) Patent No.: US 12,052,336 B2
(45) Date of Patent: Jul. 30, 2024

(54) CIRCUIT AND METHOD FOR REMOVING SPREAD SPECTRUM

(71) Applicant: LONTIUM SEMICONDUCTOR CORPORATION, Anhui (CN)

(72) Inventors: Lianliang Tai, Anhui (CN); Hongfeng Xia, Anhui (CN); Jiaxi Fu, Anhui (CN); Yu Chen, Anhui (CN); Yongling Zhang, Anhui (CN); Feng Chen, Anhui (CN)

(73) Assignee: LONTIUM SEMICONDUCTOR CORPORATION, Anhui (CN)

( * ) Notice: Subject to any disclaimer, the term of this patent is extended or adjusted under 35 U.S.C. 154(b) by 59 days.

(21) Appl. No.: 17/853,666

(22) Filed: Jun. 29, 2022

(65) Prior Publication Data
US 2023/0344615 A1 Oct. 26, 2023

(30) Foreign Application Priority Data
Apr. 26, 2022 (CN) .......................... 202210447028.4

(51) Int. Cl.
*H04L 7/00* (2006.01)
*H03L 7/08* (2006.01)
*H04B 1/69* (2011.01)

(52) U.S. Cl.
CPC .......... *H04L 7/0087* (2013.01); *H03L 7/0807* (2013.01); *H04B 1/69* (2013.01)

(58) Field of Classification Search
CPC ..... H04L 7/0087; H04L 7/033; H04L 7/0025; H03L 7/0807; H03L 7/087; H03L 7/18; H04B 1/69
See application file for complete search history.

(56) References Cited

U.S. PATENT DOCUMENTS

| 2006/0159157 A1* | 7/2006 | Seibold ................. H03L 7/0996 375/376 |
| 2006/0165204 A1* | 7/2006 | Shumarayev ............. H03L 7/14 375/376 |

(Continued)

FOREIGN PATENT DOCUMENTS

| CN | 101610083 A | 12/2009 |
| CN | 103077694 A | 5/2013 |

(Continued)

OTHER PUBLICATIONS

Chinese Office Action (in English and Chinese) regarding Application No. 202210447028.4, dated Nov. 20, 2023.

*Primary Examiner* — Sam K Ahn
*Assistant Examiner* — Amneet Singh
(74) *Attorney, Agent, or Firm* — Harness, Dickey & Pierce, P.L.C.

(57) ABSTRACT

A circuit and a method for removing spread spectrum are provided. The circuit includes a data clock recovery module and a clock extraction module that are connected. The data clock recovery module performs clock recovery on an input signal carrying spread spectrum information to obtain a parallel clock signal and a first signal, where the parallel clock signal includes frequency information and phase information, and the first signal includes the frequency information. The clock extraction module divides a frequency of the parallel clock signal to obtain a reference clock signal; acquires a feedback clock signal based on the first signal; acquires a de-spread clock signal based on the reference clock signal and the feedback clock signal, where the de-spread clock signal includes the phase information and does not include the frequency information; and divides a frequency of the de-spread clock signal to obtain an output clock signal.

10 Claims, 2 Drawing Sheets

(56) References Cited

U.S. PATENT DOCUMENTS

2012/0105120 A1 5/2012 Sornin
2020/0028662 A1* 1/2020 Brown ..................... H03L 7/18

FOREIGN PATENT DOCUMENTS

CN 105391447 A 3/2016
CN 105680851 A 6/2016

* cited by examiner

CIRCUIT AND METHOD FOR REMOVING SPREAD SPECTRUM

CROSS REFERENCE OF RELATED APPLICATION

The present application claims priority to Chinese Patent Application No. 202210447028.4, titled "CIRCUIT AND METHOD FOR REMOVING SPREAD SPECTRUM", filed on Apr. 26, 2022 with the China National Intellectual Property Administration, which is incorporated herein by reference in its entirety.

FIELD

The present disclosure relates to the field of circuits, and in particular to a circuit and a method for removing spread spectrum.

BACKGROUND

A Serializer-Deserializer (Serdes) is important to the field of high-speed serial data transmission. The serializer, also known as a Serdes transmitter, is configured to convert a parallel signal into a serial signal and transmit the serial signal out. The deserializer, also known as a Serdes receiver, is configured to convert a received serial signal into a parallel signal.

In the field of wired transmission, an upstream transmitter transmits a signal to the Serdes receiver. The signal is generally spread in the frequency domain in a link of the upstream transmitter in order to reduce EMI electromagnetic interference. A clock signal acquired at the Serdes receiver clock still carries spread spectrum information, resulting in a difficulty promoting products in practical crystal-less applications due to compatibility problems. Therefore, how to acquire a source-synchronous clock signal that is independent of the spread spectrum performed at the upstream transmitter and has the same average frequency as the signal before spread spectrum becomes a technical problem to be solved urgently.

SUMMARY

In view of this, a circuit and a method for removing spread spectrum are provided according to the present disclosure, to acquire a source-synchronous clock signal that is independent of spread spectrum performed at an upstream transmitter and has the same average frequency as a signal before spread spectrum. The technical solutions are descried as follows.

According to a first aspect of the embodiments of the present disclosure, a circuit for removing spread spectrum is provided. The circuit includes a data clock recovery module and a clock extraction module. The data clock recovery module is connected to the clock extraction module. The data clock recovery module is configured to perform clock recovery on an input signal carrying spread spectrum information to obtain a parallel clock signal and a first signal, where the parallel clock signal includes frequency information and phase information, and the first signal includes the frequency information. The clock extraction module is configured to: divide a frequency of the parallel clock signal to obtain a reference clock signal; acquire a feedback clock signal based on the first signal; acquire a de-spread clock signal based on the reference clock signal and the feedback clock signal, where the de-spread clock signal includes the phase information and does not include the frequency information; and divide a frequency of the de-spread clock signal to obtain an output clock signal.

In an embodiment, the first signal includes first data. The clock extraction module includes: a first phase locked loop, a first phase interpolator, a first frequency divider, a second frequency divider, and a third frequency divider. The first frequency divider is configured to divide the frequency of the parallel clock signal to obtain the reference clock signal. The first phase interpolator is configured to acquire a first clock signal based on the first data and a phase clock signal. The second frequency divider is configured to divide a frequency of the first clock signal to obtain the feedback clock signal. The first phase locked loop is configured to acquire the de-spread clock signal and the phase clock signal based on the reference clock signal and the feedback clock signal, and transmit the phase clock signal to the first phase interpolator. The third frequency divider is configured to divide the frequency of the de-spread spectrum clock signal to obtain the output clock signal.

In an embodiment, the first signal is a first voltage signal, and the clock extraction module includes a phase frequency detector, a first charge pump, a first low-pass filter, a first voltage-controlled oscillator, a delay-locked loop or second phase interpolator, a fourth frequency divider, a fifth frequency divider, and a sixth frequency divider. The fourth frequency divider is configured to divide the frequency of the parallel clock signal to obtain the reference clock signal. The first voltage-controlled oscillator is configured to acquire the de-spread clock signal based on the first voltage signal. The delay-locked loop or second phase interpolator is configured to acquire a first clock signal based on the de-spread clock signal and the first voltage signal. The fifth frequency divider is configured to divide a frequency of the first clock signal to obtain the feedback clock signal. The phase frequency detector is configured to acquire a second clock signal based on the reference clock signal and the feedback clock signal. The first charge pump is configured to acquire a first pulse signal based on the second clock signal. The first low-pass filter is configured to filter the first pulse signal to obtain the first voltage signal. The sixth frequency divider is configured to divide the frequency of the de-spread clock signal to obtain the output clock signal.

In an embodiment, the data clock recovery module includes a reference clock generation module, a third phase interpolator, a serial-to-parallel conversion module, and a phase interpolator control module. The reference clock generation module is configured to generate a high-speed source clock signal. The third phase interpolator is configured to perform frequency fixing on the high-speed source clock and a control coding signal to obtain a sampling clock signal, where the control coding signal includes a third clock signal and second data. The serial-to-parallel conversion module is configured to sample the input signal based on the sampling clock signal, and convert a sampling result into parallel data and the parallel clock signal. The phase interpolator control module is configured to convert the parallel data and the parallel clock signal into the first data, the second data and the third clock signal.

In an embodiment, the reference clock generation module includes a first internal oscillator and a second phase locked loop. The first internal oscillator is configured to generate a first reference clock signal. The second phase locked loop is configured to perform frequency multiplication on the first reference clock signal to obtain the high-speed source clock signal.

In an embodiment, the reference clock generation module includes a second internal oscillator. The second internal oscillator is configured to generate the high-speed source clock signal.

In an embodiment, the reference clock generation module includes a frequency detector, a phase detector, a second charge pump, a third charge pump, a second low-pass filter, and a second voltage-controlled oscillator. The frequency detector is configured to acquire a second signal including frequency information based on the input signal and a fourth clock signal. The second charge pump is configured to acquire the first voltage signal based on the second signal. The phase detector is configured to generate the parallel clock signal and a third signal that includes phase information based on the input signal and the fourth clock signal. The third charge pump is configured to acquire a second voltage signal based on the third signal. The second low-pass filter is configured to filter the first voltage signal and the second voltage signal to obtain a third voltage signal. The second voltage-controlled oscillator configured to output the fourth clock signal to the frequency detector and the phase detector based on the third voltage signal.

In an embodiment, the phase interpolator control module includes a phase detection module, a proportional regulation unit, an integral regulation unit, an accumulation delay unit, and an adder. The phase detection module is configured to acquire a difference in phase between the parallel clock signal and the parallel data, and quantize the difference into a first digital signal. The proportional regulation unit is configured to perform proportional control on the first digital signal to obtain a second digital signal. The integral regulation unit is configured to perform proportional control on the first digital signal to obtain a third digital signal. The accumulation delay unit is configured to perform integral filtering on the third digital signal to obtain the second data. The adder is configured to add the second digital signal to the second data.

According to a second aspect of the embodiments of the present disclosure, a method for removing spread spectrum is further provided. The method includes: performing clock recovery on an input signal carrying spread spectrum information to obtain a parallel clock signal and a first signal, where the parallel clock signal includes frequency information and phase information, and the first signal includes the frequency information; dividing a frequency of the parallel clock signal to obtain a reference clock signal, and acquiring a feedback clock signal based on the first signal; acquiring a de-spread clock signal based on the reference clock signal and the feedback clock signal, where the de-spread clock signal includes the phase information and does not include the frequency information; and dividing a frequency of the de-spread clock signal to obtain an output clock signal.

In an embodiment, the first signal includes first data. The performing clock recovery on an input signal carrying spread spectrum information to obtain a parallel clock signal and a first signal includes: acquiring a high-speed source clock signal; performing frequency fixing on the high-speed source clock and a control coding signal to obtain a sampling clock signal, where the control coding signal includes a third clock signal and second data; sampling the input signal based on the sampling clock signal, and converting a sampling result into parallel data and the parallel clock signal; and converting the parallel data and the parallel clock signal into the first data, the second data and the third clock signal.

A circuit and a method for removing spread spectrum are provided according to the embodiments of the present disclosure. The circuit includes a data clock recovery module and a clock extraction module. The data clock recovery module is connected to the clock extraction module. The data clock recovery module is configured to perform clock recovery on an input signal carrying spread spectrum information to obtain a parallel clock signal and a first signal, where the parallel clock signal includes frequency information and phase information, and the first signal includes the frequency information. The clock extraction module is configured to: divide a frequency of the parallel clock signal to obtain a reference clock signal; acquire a feedback clock signal based on the first signal; acquire a de-spread clock signal based on the reference clock signal and the feedback clock signal, where the de-spread clock signal includes the phase information and does not include the frequency information; and divide a frequency of the de-spread clock signal to obtain an output clock signal. It can be seen that in the embodiments of the present disclosure, the clock data recovery module acquires the first signal including only the frequency information, and then the clock extraction module performs clock extraction on the parallel clock signal including the frequency information and the phase information and the first signal including only the frequency information to obtain the de-spread clock signal including only the phase information, so as to output the de-spread clock signal, thereby improving compatibility, reducing the hardware cost and complexity of the system, reducing the difficulty in crystal-less integration technology, and further improving the integration of bridge chips.

BRIEF DESCRIPTION OF THE DRAWINGS

In order to more clearly describe the technical solutions in the embodiments of the present disclosure or the technical solutions in the conventional technology, drawings to be used in the description of the embodiments of the present disclosure or the conventional technology are briefly described hereinafter. It is apparent that the drawings described below illustrate merely some embodiments of the present disclosure, and those skilled in the art may obtain other drawings based on the provided drawings without any creative effort.

DETAILED DESCRIPTION OF EMBODIMENTS

Figure 1:
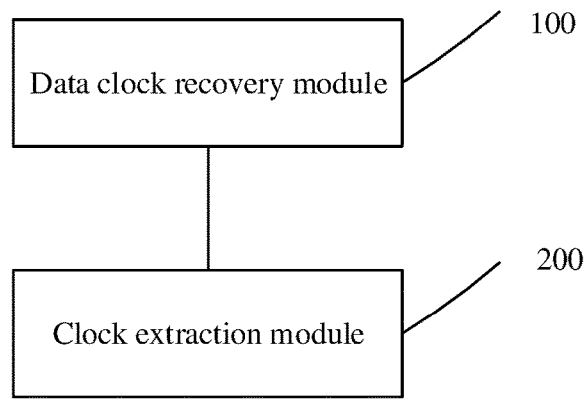
FIG. 1 is a schematic structural diagram illustrating a circuit for removing spread spectrum according to an embodiment of the present disclosure.

The embodiments of the present disclosure are described in detail below with reference to the drawings, so that the above objects, features and advantages of the present disclosure are understandable.

Various details are set forth in the following description to facilitate a full understanding of the present disclosure. However, the present disclosure may be implemented in other ways different from those described herein. Those skilled in the art may make similar promotion without departing from the connotation of the present disclosure.

Therefore, the present disclosure is not limited to the embodiments disclosed below.

For high-speed interfaces supporting spread spectrum, such as DisplayPort, low-voltage differential signaling (LVDS), and mobile industry processor interface (MIPI), a signal is successfully received by a receiver with the conventional Serdes technology together with the technical support of an integrated internal oscillator. However, the jitter requirements at the Serdes transmitter are stringent in the specifications, and the performance of the internal oscillator cannot fully meet the requirements of the Serdes transmitter under different specifications. Even if the specifications are met, a compatibility problem may be encountered in practical applications, resulting in a difficulty in promoting products. Therefore, it is desired to acquire a source-synchronous clock signal that is independent of the spread spectrum performed at an upstream transmitter and has the same average frequency as a signal before spread spectrum. Then, subsequent functions are implemented with the clock signal as a reference source. As long as the limitation of the spread spectrum is broken, the hardware cost and complexity of the system can be further reduced, facilitating a possibility for further improving the integration of more crystal-less bridge chips.

Base on the above technical problems, a circuit and a method for removing spread spectrum are provided according to the embodiments of the present disclosure. The circuit includes a data clock recovery module and a clock extraction module. The data clock recovery module is connected to the clock extraction module. The data clock recovery module is configured to perform clock recovery on an input signal carrying spread spectrum information, to obtain a parallel clock signal and a first signal. The parallel clock signal includes frequency information and phase information. The first signal includes the frequency information. The clock extraction module is configured to: divide a frequency of the parallel clock signal to obtain a reference clock signal, acquire a feedback clock signal based on the first signal, and acquire a de-spread clock signal based on the reference clock signal and the feedback clock signal. The de-spread clock signal includes the phase information and does not include the frequency information. Further, the clock extraction module is configured to divide a frequency of the de-spread clock signal to obtain an output clock signal. It can be seen that in the embodiments of the present disclosure, the clock data recovery module acquires the first signal including only the frequency information, and then the clock extraction module performs clock extraction on the parallel clock signal including the frequency information and the phase information and the first signal including only the frequency information to obtain the de-spread clock signal including only the phase information, so as to output the de-spread clock signal, thereby improving compatibility, reducing the hardware cost and complexity of the system, reducing the difficulty in crystal-less integration technology, and further improving the integration of bridge chips.

For ease of understanding, the circuit and the method for removing spread spectrum according to the embodiments of the present disclosure are described in detail below in combination with the drawings. The present disclosure is applicable to the application field of high-speed Serdes interfaces supporting spread spectrum, such as DisplayPort, LVDS, and MIPI.

Reference is made to FIG. 1, which is a schematic structural diagram illustrating a circuit for removing spread spectrum according to an embodiment of the present disclosure. The circuit includes a data clock recovery module 100 and a clock extraction module 200. The data clock recovery module 100 is connected to the clock extraction module 200. An input signal that has spread in the frequency domain may be inputted to the Serdes receiver. The data clock recovery module 100 is configured perform clock recovery on the input signal eq-data carrying spread spectrum information, to obtain a parallel clock signal clk0 and a first signal. The parallel clock signal clk0 includes frequency information and phase information. The first signal includes the frequency information. The clock extraction module 200 is configured to divide a frequency of the parallel clock signal clk0 to obtain a reference clock signal ref-clk, acquire a feedback clock signal fb-clk based on the first signal, and acquire a de-spread clock signal based on the reference clock signal ref-clk and the feedback clock signal fb-clk. The de-spread clock signal includes phase information and does not include the frequency information. The clock extraction module 200 is further configured to divide a frequency of the de-spread clock signal to obtain an output clock signal out-ref-clk.

Figure 2:
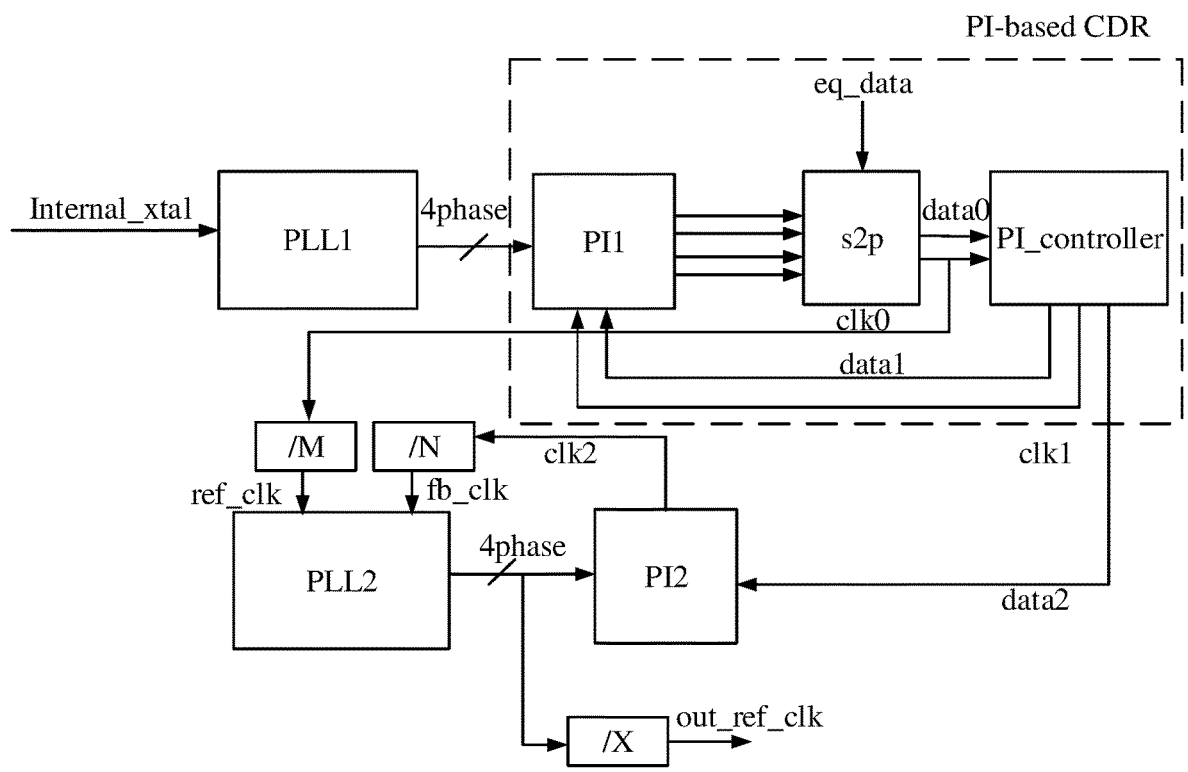
FIG. 2 is a circuit diagram illustrating a circuit for removing spread spectrum according to an embodiment of the present disclosure.

In the embodiment of the present disclosure, the first signal may include first data data2. Reference is made to FIG. 2, which is a circuit diagram illustrating a circuit for removing spread spectrum according to an embodiment of the present disclosure, that is, a circuit diagram of the Serdes receiver. The circuit includes an internal oscillator, and it is considered that the Serdes receiver is integrated with an external crystal oscillator. However, phase noise at a low-frequency is too large to meet some requirements of the system. In the present disclosure, the external crystal oscillator is integrated and has a high-speed Serdes transceiver circuit device as a limitation. A phase noise index of the internal crystal meets requirements of the Serdes receiver. First, the Serdes receiver performs frequency multiplication on the internal oscillator with a second phase locked loop (PLL), and perform data clock recovery together with an architecture based on a phase interpolator (PI). The frequency information obtained in this way is digitized. The digitized information is freely adjustable, and is more flexible than an analog signal. Then, the first signal including the frequency information generated from the data clock recovery logic is transmitted to a first phase locked loop. The frequency information is removed directly by a phase frequency detector (PFD) in the first phase locked loop. In this way, the first phase locked loop generates a clock source including only the phase information, that is, the de-spread clock signal.

In the embodiment of the present disclosure, the data clock recovery module may include a reference clock generation module, a third phase interpolator PI1, a serial-to-parallel conversion module s2p and a phase interpolator control module PI-controller. The reference clock generation module is configured to generate a high-speed source clock signal. The reference clock generation module may include a first internal oscillator and a second phase locked loop PLL1. The first internal oscillator is configured to generate a first reference clock signal internal-xtal. The second phase locked loop PLL1 is configured to perform frequency multiplication on the first reference clock signal to obtain a high-speed source clock signal. The Serdes receiver determines the first reference clock signal internal-xtal generated by the first internal oscillator as a reference clock signal of the PLL1, and performs frequency multiplication on the reference clock signal to generate an operation clock frequency expected by the Serdes receiver. The PLL1 generates 4phase or 8phase as a high-speed source clock signal for the PI1.

In another embodiment, the reference clock generation module may include a second internal oscillator. The second internal oscillator is configured to generate a high-speed source clock signal. In this case, the second internal oscillator functions as the PLL1 and directly outputs the high-speed source clock signal.

In the embodiment of the present disclosure, the third phase interpolator PI1 is configured to perform frequency fixing on the high-speed source clock and a control coding signal to obtain a sampling clock signal. The control coding signal includes a third clock signal clk1 and second data data1. The PI1 mixes the high-speed source clock signal with the control coding signal (clk1 and data1) transmitted by the PI controller, to generate the sampling clock signal expected by a slicer inside the s2p. In the embodiments of the present disclosure, the serial-to-parallel conversion module s2p is configured to sample the input signal eq-data based on the sampling clock signal, and convert a sampling result into parallel data data0 and a parallel clock signal clk0. The slicer samples the eq-data, and converts serial data into parallel data data0 and a parallel clock signal clk0, and transmits the parallel data data0 and the parallel clock signal clk0 to the PI controller. It can be considered that eq-data is prepared in advance, and the system has given an optimal EQ parameter, so that a modulated input signal is directly inputted to the Serdes receiver.

In the embodiment of the present disclosure, the phase interpolator control module PI-controller is configured to convert the parallel data data0 and the parallel clock signal clk0 into the first data data2, the second data data1 and the third clock signal clk1. A phase detection module in the PI controller acquires a difference in phase between the parallel data data0 and the parallel clock signal clk0, to determine whether there is phase advance or phase delay in a current sampling clock signal. Then, the difference in phase is quantized into a digital signal and the digital signal is transmitted to a PID filter module. The PID filter module calculates the second data data1 and the first data data2. The second data data1 and the third clock signal clk1 are transmitted to the phase interpolator PI1 to generate another sampling clock signal for subsequent sampling. In this way, a negative feedback loop is formed until convergence. The convergence may be that a difference between a frequency of the third clock signal clk1 and a predetermined frequency is within a threshold range. It should be understood that the phase detection module may be but not limited to a bang-bang phase detector (PD).

In the embodiment of the present disclosure, the data clock recovery module performs clock recovery on the input signal to acquire the parallel clock signal clk0 and the first data data2. Next, the clock extraction module performs clock extraction on the parallel clock signal clk0 and the first data data2 to obtain the de-spread clock signal.

In the embodiment of the present disclosure, the first signal may include the first data data2. The clock extraction module includes a first phase locked loop PLL2, a first phase interpolator PI2, a first frequency divider /M, a second frequency divider /N and a third frequency divider /X. The first frequency divider is configured to divide a frequency of the parallel clock signal clk0 to obtain the reference clock signal ref-clk. The first phase interpolator is configured to acquire the first clock signal clk2 based on the first data data2 and the phase clock signal. The PI2 is reset until convergence of the negative feedback loop in the data clock recovery module and successful phase lock of the PLL2. The second frequency divider is configured to divide a frequency of the first clock signal clk2 to obtain the feedback clock signal fb-clk. The third frequency divider is configured to divide a frequency of the de-spread clock signal to obtain the output clock signal out-ref-clk.

In the embodiment of the present disclosure, the first phase locked loop is configured to acquire the de-spread clock signal and the phase clock signal based on the reference clock signal ref-clk and the feedback clock signal fb-clk. The phase clock signal may be of 4phase or 8phase. The first phase locked loop is further configured to transmit the phase clock signal to the first phase interpolator. The PFD module in the PLL2 receives the reference clock signal ref-clk originally from the clk0. The clk0 includes full spread spectrum information, that is, frequency information and phase information. The fb-clk is originally from the PI2. Since the data2 serves as coding information for the PI2, the generated fb-clk includes only frequency information. The frequency information is directly removed by the PFD in the PLL2. A charge pump (CP) module included in the PLL2 no longer follows the frequency information. In this way, a relatively pure clock source signal out-ref-clk is generated by a loop filter in the PLL2. The degree of purity depends on the data2 from the PI controller.

In the embodiment of the present disclosure, the second data data1 includes complete frequency information and phase information and thus cannot be directly transmitted to PI2 for use. A final clock obtained directly based on the second data data1 may be restored to an integrated oscillator. Therefore, the first data data2 including only the frequency information is calculated, so that the PLL2 removes the frequency information in the data2 to obtain the de-spread clock signal.

Figure 3:
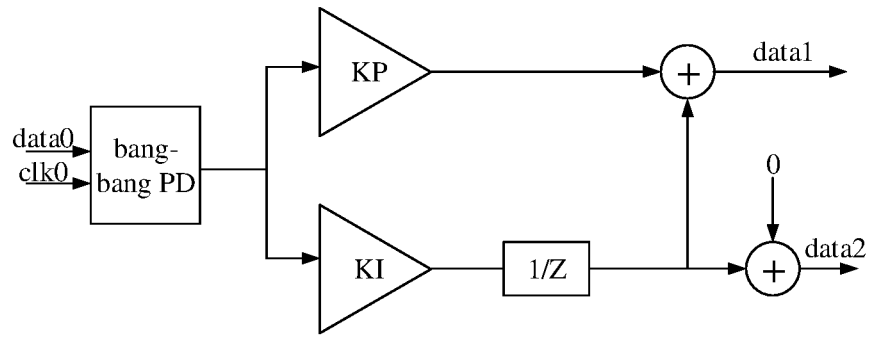
FIG. 3 is a schematic structural diagram illustrating a phase interpolator control module according to an embodiment of the present disclosure.

Reference is made to FIG. 3, which is a schematic structural diagram illustrating a phase interpolator control module according to an embodiment of the present disclosure. The phase interpolator control module includes a phase detection module bang-bang PD, a proportional regulation unit KP, an integral regulation unit KI, an accumulation delay unit 1/Z and an adder. The phase detection module is configured to acquire a difference in phase between the parallel clock signal clk0 and the parallel data data0, and quantize the difference into a first digital signal. The proportional regulation unit is configured to perform proportional control on the first digital signal to obtain a second digital signal. The integral regulation unit is configured to perform proportional control on the first digital signal to obtain a third digital signal. The accumulation delay unit is configured to perform integral filtering on the third digital signal to obtain second data. The adder is configured to add the second digital signal to the second data.

In the embodiment of the present disclosure, the spread spectrum information is removed without an external crystal, so that the application range of the Serdes technology in the field of bridging or conversion is free, thereby realizing the goal of high-speed Serdes integrated crystals.

Figure 4:
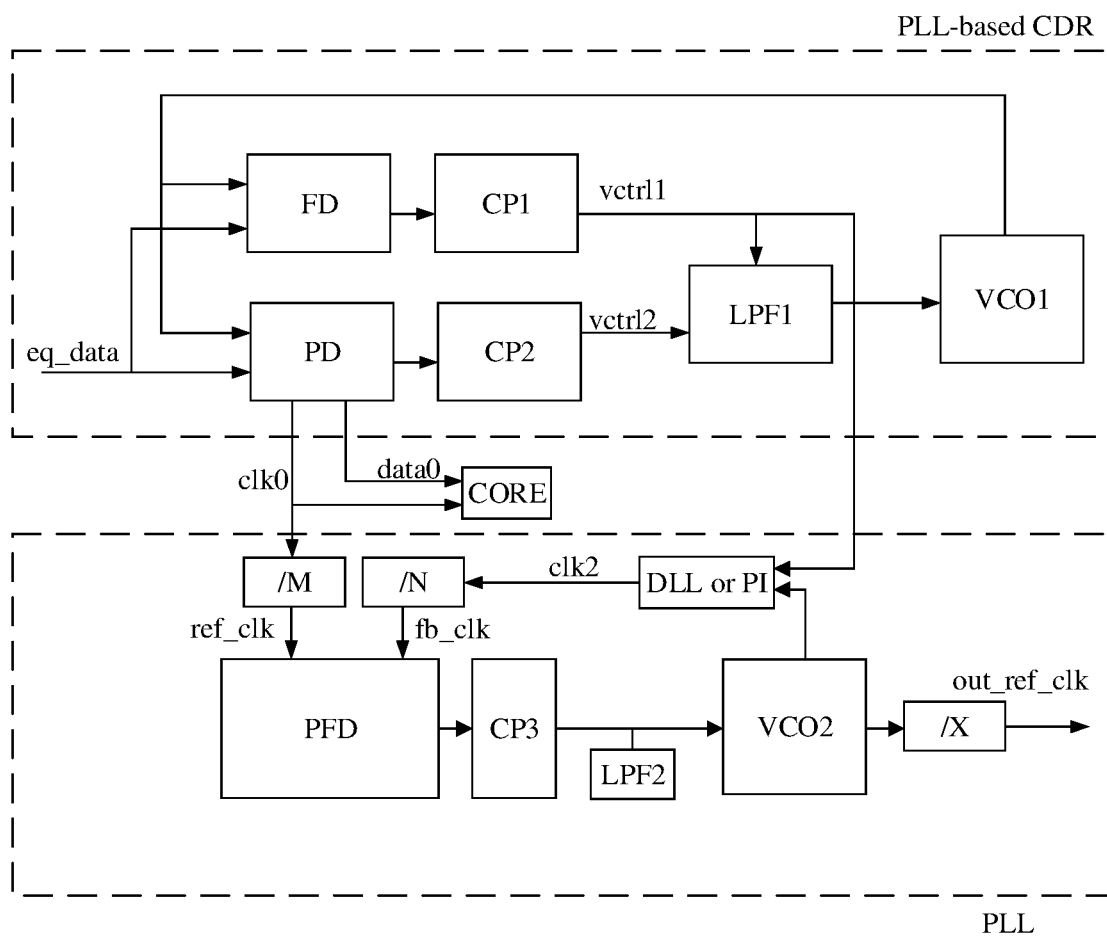
FIG. 4 is a circuit diagram illustrating a circuit for removing spread spectrum according to another embodiment of the present disclosure.

In another embodiment, the data clock recovery module is an analog data clock recovery module, and the first signal is an analog signal. The PLL2 may include no PI module since a delay-locked loop (DLL) circuit under control of the analog signal functions as a PI module. In addition, a high-performance internal oscillator and the PLL1 are unnecessary. Reference is made to FIG. 4, which is a circuit diagram illustrating a circuit for removing spread spectrum according to another embodiment of the present disclosure. The circuit includes a data clock recovery module PLL-based CDR and a clock extraction module PLL.

In the embodiment of the present disclosure, the data clock recovery module PLL-based CDR includes a frequency detector FD, a phase detector PD, a second charge pump CP1, a third charge pump CP2, a second low-pass filter LPF1, and a second voltage-controlled oscillator VCO1. In the PLL-based CDR, a frequency detection loop and a phase detection loop operate simultaneously. The frequency detector is configured to acquire a second signal including frequency information based on the input signal and a fourth clock signal. The second charge pump is configured to acquire a first voltage signal vctrl1 based on the second signal. The phase detector is configured to generate a parallel clock signal and a third signal that includes phase information based on the input signal and the fourth clock signal. The third charge pump is configured to acquire a second voltage signal vctrl2 based on the third signal. The second low-pass filter is configured to filter the first voltage signal vctrl1 and the second voltage signal vctrl2 to obtain a third voltage signal. The second voltage-controlled oscillator is configured to output the fourth clock signal to the frequency detector and the phase detector based on the third voltage signal.

In the embodiment of the present disclosure, the first signal is the first voltage signal vctrl1. The clock extraction module may include a phase frequency detector, a first charge pump, a first low-pass filter, a first voltage-controlled oscillator, a delay-locked loop or a second phase interpolator, a fourth frequency divider, a fifth frequency divider and a sixth frequency divider. The fourth frequency divider is configured to divide a frequency of the parallel clock signal clk0 to obtain the reference clock signal ref-clk. The first voltage-controlled oscillator is configured to acquire a de-spread clock signal based on the first voltage signal. The delay-locked loop or the second phase interpolator is configured to acquire a first clock signal based on the de-spread clock signal and the first voltage signal vctrl1. The fifth frequency divider is configured to divide a frequency of the first clock signal to obtain a feedback clock signal fb-clk. The phase frequency detector is configured to acquire a second clock signal vctrl2 based on the reference clock signal ref-clk and the feedback clock signal fb-clk. The first charge pump is configured to acquire a first pulse signal based on the second clock signal. The first low-pass filter is configured to filter the first pulse signal to obtain the first voltage signal. The sixth frequency divider is configured to divide a frequency of the de-spread clock signal to obtain an output clock signal out-ref-clk. It should be understood that the parallel clock signal clk0 and the parallel data data0 may be inputted to a digital processing core module CORE for other processing.

The circuit for removing spread spectrum according to the embodiments of the present disclosure includes a data clock recovery module and a clock extraction module. The data clock recovery module is connected to the clock extraction module. The data clock recovery module is configured to perform clock recovery on an input signal carrying spread spectrum information, to obtain a parallel clock signal and a first signal. The parallel clock signal includes frequency information and phase information. The first signal includes frequency information. The clock extraction module is configured to divide a frequency of the parallel clock signal to obtain a reference clock signal, acquire a feedback clock signal based on the first signal, acquire a de-spread clock signal based on the reference clock signal and the feedback clock signal. The de-spread clock signal includes phase information and does not include the frequency information. Further, the clock extraction module is configured to divide a frequency of the de-spread clock signal to obtain an output clock signal. It can be seen that in the embodiments of the present disclosure, the clock data recovery module acquires the first signal including only the frequency information, and then the clock extraction module performs clock extraction on the parallel clock signal including the frequency information and the phase information and the first signal including only the frequency information to obtain the de-spread clock signal including only the phase information, so as to output the de-spread clock signal, thereby improving compatibility, reducing the hardware cost and complexity of the system, reducing the difficulty in crystal-less integration technology, and further improving the integration of bridge chips.

Based on the above circuit for removing spread spectrum, a method for removing spread spectrum is further provided according to the embodiments of the present disclosure. The method includes the following steps S101 to S104.

In step S101, clock recovery is performed on an input signal carrying spread spectrum information to obtain a parallel clock signal and a first signal. The parallel clock signal includes frequency information and phase information. The first signal includes frequency information.

In step S102, a frequency of the parallel clock signal is divided to obtain a reference clock signal. A feedback clock signal is acquired based on the first signal.

In step S103, a de-spread clock signal is obtained based on the reference clock signal and the feedback clock signal. The de-spread clock signal includes the phase information and does not include the frequency information.

In step S104, a frequency of the de-spread clock signal is divided to obtain an output clock signal.

In an embodiment, the first signal includes first data. Clock recovery is performed on the input signal carrying the spread spectrum information to obtain the parallel clock signal and the first signal by: acquiring a high-speed source clock signal; performing frequency fixing on the high-speed source clock and a control coding signal to obtain a sampling clock signal, where the control coding signal includes a third clock signal and second data; sampling the input signal based on the sampling clock signal, and converting a sampling result into parallel data and the parallel clock signal; and converting the parallel data and the parallel clock signal into the first data, the second data and the third clock signal.

The method for removing spread spectrum according to the embodiments of the present disclosure includes: performing clock recovery on an input signal carrying spread spectrum information to obtain a parallel clock signal and a first signal, where the parallel clock signal includes frequency information and phase information and the first signal includes the frequency information; dividing a frequency of the parallel clock signal to obtain a reference clock signal, and acquiring a feedback clock signal based on the first signal; acquiring a de-spread clock signal based on the reference clock signal and the feedback clock signal, where the de-spread clock signal includes the phase information and does not include the frequency information; and dividing a frequency of the de-spread clock signal to obtain an output clock signal. It can be seen that in the embodiments of the present disclosure, the clock data recovery module acquires the first signal including only the frequency information, and then the clock extraction module performs clock extraction on the parallel clock signal including the frequency information and the phase information and the first signal including only the frequency information to obtain the de-spread clock signal including only the phase information, so as to output the de-spread clock signal, thereby improving compatibility, reducing the hardware cost and complexity of the system, reducing the difficulty in crystal-less integration technology, and further improving the integration of bridge chips.

The embodiments in this specification are described in a progressive way. For the same or similar parts among the embodiments, reference is made to description of other embodiments. Each of the embodiments emphasizes the differences from others. Since the device disclosed in the embodiments is basically similar to the method therein, the description thereof is relatively simple, and for relevant matters, reference is to the description of the method embodiments.

Only preferred embodiments of the present disclosure are described above. Although the present disclosure is disclosed above in conjunction with the preferred embodiments, the preferred embodiments are not intended to limit the present disclosure. Those skilled in the art, without departing from the scope of the technical solutions of the present disclosure, may make variations and modifications to the technical solutions of the present disclosure based on the above disclosed method and technical solutions, or modify the embodiments to equivalent embodiments. Therefore, all simple modifications, equivalent changes and modifications made to the above embodiments based on the technical essence of the present disclosure without departing from the technical solutions of the present disclosure fall within the protection scope of the technical solutions of the present disclosure.

The invention claimed is:

1. A circuit for removing spread spectrum, comprising: a data clock recovery module and a clock extraction module, wherein
the data clock recovery module is connected to the clock extraction module;
the data clock recovery module is configured to perform clock recovery on an input signal carrying spread spectrum information to obtain a parallel clock signal and a first signal, wherein the parallel clock signal comprises frequency information and phase information, and the first signal comprises the frequency information; and
the clock extraction module is configured to: divide a frequency of the parallel clock signal to obtain a reference clock signal; acquire a feedback clock signal based on the first signal; acquire a de-spread clock signal based on the reference clock signal and the feedback clock signal, wherein the de-spread clock signal comprises the phase information and does not comprise the frequency information; and divide a frequency of the de-spread clock signal to obtain an output clock signal.

2. The circuit according to claim 1, wherein the first signal comprises first data, and wherein the clock extraction module comprises:
a first frequency divider configured to divide the frequency of the parallel clock signal to obtain the reference clock signal;
a first phase interpolator configured to acquire a first clock signal based on the first data and a phase clock signal;
a second frequency divider configured to divide a frequency of the first clock signal to obtain the feedback clock signal;
a first phase locked loop configured to acquire the de-spread clock signal and the phase clock signal based on the reference clock signal and the feedback clock signal, and transmit the phase clock signal to the first phase interpolator; and
a third frequency divider configured to divide the frequency of the de-spread spectrum clock signal to obtain the output clock signal.

3. The circuit according to claim 1, wherein the first signal is a first voltage signal, and wherein the clock extraction module comprises:
a fourth frequency divider configured to divide the frequency of the parallel clock signal to obtain the reference clock signal;
a first voltage-controlled oscillator configured to acquire the de-spread clock signal based on the first voltage signal;
a delay-locked loop or second phase interpolator configured to acquire a first clock signal based on the de-spread clock signal and the first voltage signal;
a fifth frequency divider configured to divide a frequency of the first clock signal to obtain the feedback clock signal;
a phase frequency detector configured to acquire a second clock signal based on the reference clock signal and the feedback clock signal;
a first charge pump configured to acquire a first pulse signal based on the second clock signal;
a first low-pass filter configured to filter the first pulse signal to obtain the first voltage signal; and
a sixth frequency divider configured to divide the frequency of the de-spread clock signal to obtain the output clock signal.

4. The circuit according to claim 2, wherein the data clock recovery module comprises:
a reference clock generation module configured to generate a high-speed source clock signal;
a third phase interpolator configured to perform frequency fixing on the high-speed source clock and a control coding signal to obtain a sampling clock signal, wherein the control coding signal comprises a third clock signal and second data;
a serial-to-parallel conversion module configured to sample the input signal based on the sampling clock signal, and convert a sampling result into parallel data and the parallel clock signal; and
a phase interpolator control module configured to convert the parallel data and the parallel clock signal into the first data, the second data and the third clock signal.

5. The circuit according to claim 4, wherein the reference clock generation module comprises:
a first internal oscillator configured to generate a first reference clock signal; and
a second phase locked loop configured to perform frequency multiplication on the first reference clock signal to obtain the high-speed source clock signal.

6. The circuit according to claim 4, wherein the reference clock generation module comprises:
a second internal oscillator configured to generate the high-speed source clock signal.

7. The circuit according to claim 3, wherein the data clock recovery module comprises:
a frequency detector configured to acquire a second signal comprising frequency information based on the input signal and a fourth clock signal;
a second charge pump configured to acquire the first voltage signal based on the second signal;
a phase detector configured to acquire the parallel clock signal and a third signal that comprises phase information based on the input signal and the fourth clock signal;

a third charge pump configured to acquire a second voltage signal based on the third signal;

a second low-pass filter configured to filter the first voltage signal and the second voltage signal to obtain a third voltage signal; and a second voltage-controlled oscillator configured to output the fourth clock signal to the frequency detector and the phase detector based on the third voltage signal.

8. The circuit according to claim 4, wherein the phase interpolator control module comprises:

a phase detection module configured to acquire a difference in phase between the parallel clock signal and the parallel data, and quantize the difference into a first digital signal;

a proportional regulation unit configured to perform proportional control on the first digital signal to obtain a second digital signal;

an integral regulation unit configured to perform proportional control on the first digital signal to obtain a third digital signal;

an accumulation delay unit configured to perform integral filtering on the third digital signal to obtain the second data; and an adder configured to add the second digital signal to the second data.

9. A method for removing spread spectrum, comprising:

performing clock recovery on an input signal carrying spread spectrum information to obtain a parallel clock signal and a first signal, wherein the parallel clock signal comprises frequency information and phase information, and the first signal comprises the frequency information;

dividing a frequency of the parallel clock signal to obtain a reference clock signal, and acquiring a feedback clock signal based on the first signal;

acquiring a de-spread clock signal based on the reference clock signal and the feedback clock signal, wherein the de-spread clock signal comprises the phase information and does not comprise the frequency information; and dividing a frequency of the de-spread clock signal to obtain an output clock signal.

10. The method according to claim 9, wherein the first signal comprises first data, and wherein the performing clock recovery on an input signal carrying spread spectrum information to obtain a parallel clock signal and a first signal comprises:

acquiring a high-speed source clock signal;

performing frequency fixing on the high-speed source clock and a control coding signal to obtain a sampling clock signal, wherein the control coding signal comprises a third clock signal and second data;

sampling the input signal based on the sampling clock signal, and converting a sampling result into parallel data and the parallel clock signal; and converting the parallel data and the parallel clock signal into the first data, the second data and the third clock signal.

\* \* \* \* \*